United States Patent [19]

Davis et al.

[11] Patent Number: 5,536,579
[45] Date of Patent: Jul. 16, 1996

[54] DESIGN OF HIGH DENSITY STRUCTURES WITH LASER ETCH STOP

[75] Inventors: Charles R. Davis, Wappingers Falls; Frank D. Egitto; Eugene R. Skarvinko, both of Binghamton, all of N.Y.

[73] Assignee: International Business Machines Corporation, Armonk, N.Y.

[21] Appl. No.: 253,084

[22] Filed: Jun. 2, 1994

[51] Int. Cl.⁶ ....................................................... B32B 9/00
[52] U.S. Cl. .......................... 428/421; 428/209; 428/323; 428/325; 428/473.5; 219/121.6; 427/531
[58] Field of Search ...................................... 428/323, 421, 428/473.5, 209, 325

[56] References Cited

U.S. PATENT DOCUMENTS

| | | | |
|---|---|---|---|
| 4,335,180 | 6/1982 | Traut | 428/422 |
| 4,568,409 | 2/1986 | Caplan | 156/643 |
| 4,634,631 | 1/1987 | Gazit et al. | 428/421 |
| 4,644,130 | 2/1987 | Bachmann | 219/121 LJ |
| 4,647,508 | 3/1987 | Gazit et al. | 428/421 |
| 4,915,981 | 4/1990 | Traskos et al. | 427/53.1 |
| 4,931,134 | 6/1990 | Hatkevitz et al. | 156/630 |
| 4,935,584 | 6/1990 | Boggs | 174/262 |
| 4,959,119 | 9/1990 | Lantzer | 156/644 |
| 4,961,259 | 10/1990 | Schreiber | 29/852 |
| 4,964,212 | 10/1990 | Deroux-Dauphin et al. | 29/852 |
| 5,055,342 | 10/1991 | Markovich et al. | 428/137 |
| 5,284,710 | 2/1994 | Hartley et al. | 428/421 |
| 5,316,803 | 5/1994 | White, Jr. et al. | 427/96 |
| 5,354,611 | 10/1994 | Arthur et al. | 428/421 |

Primary Examiner—Patrick J. Ryan
Assistant Examiner—Kam F. Lee
Attorney, Agent, or Firm—Pollock, Vande Sande & Priddy

[57] ABSTRACT

A multi-layer electronic circuit package including at least one electrically conductive plane, a first organic polymeric dielectric material having a first optical absorbency to an ablating wavelength of laser light, and a second organic polymeric dielectric material having a second optical absorbency to the ablating wavelength of laser light. The first material dielectric material absorbs wavelengths of light that are not the same as wavelengths of light that are absorbed by the second dielectric material. A first layer of the first or the second organic polymeric materials overlays at least one surface of the at least one electrically conductive plane and a second layer of the other of the first and second organic polymeric materials overlays the first layer.

8 Claims, 4 Drawing Sheets

500 X

350 X

500 X

DESIGN OF HIGH DENSITY STRUCTURES WITH LASER ETCH STOP

FIELD OF THE INVENTION

The present invention relates to multi-layer circuit packages having laser drilled blind vias between internal circuitization planes for the purpose of electrical interconnection.

BACKGROUND OF THE INVENTION

In the fabrication of multi-layer circuit boards and cards, it is necessary to form passages such as vias and through holes from one layer of the structure to a deeper layer. Such passages may be formed mechanically, chemically or by using lasers of various wavelengths to vaporize or burn away the circuit board material. Blind vias are passages that do not pass completely through a board or card. After formation of a blind via, material, such as a metal, may be deposited on the surface of the via to provide an electrical, power, or ground connection between the two layers connected to the via. In other words, the blind vias may be formed for plating of joining metallurgy which provides the interelectrical connections within the multi-layer structure.

Lasers are commonly used to drill blind vias through the insulating polymeric dielectric of multi-layer structures to metal lands to establish interplanar electrical interconnection. These multi-layer structures usually include multiple layers of the same polymeric dielectric material laminated to both sides of the structure; the vias may be formed on either side. In drilling such blind vias, it is critical to the operability of the multi-layer structure that registration between the laser and the internal metal land be achieved. Occurrence of misregistration may result in removal of dielectric material adjacent to the land and continuing to the internal metal planes leading to electrical shorts upon subsequent plating.

Complicating the successful formation of such blind vias and multi-layer structures described above is the fact that successive dielectric layers such as the core and joining level dielectric layer, are often formed of the same dielectric material. While employing the same dielectric material provides certain processing advantages, e.g., being able to use the same hole making techniques for both layers, for example excimer laser drilling, it introduces a problem if misregistration occurs. If misregistration occurs during drilling of blind vias to the underlying lands, this undesirable attack of the inner, core-level dielectric may result. If there is significant misregistration, the laser drilled blind via will not stop at the circuitization layer within the package, but rather, the laser will continue to drill through the structure to the underlying metal layer. Misregistration can be potentially deleterious to the integrity of the package since it can lead to electrical shorts between joining metallurgy and the power plane upon subsequent plating.

SUMMARY OF THE INVENTION

The present invention solves the problems existing in the prior art by providing a design incorporating material and methods for fabricating high density structures, eliminating misregistration concerns without sacrificing the electrical and mechanical integrity of the structure.

Accordingly, the present invention provides a multi-layer electronic circuit package including at least one electrically conductive plane, a first organic polymeric dielectric material having a first optical absorbency to an ablating wavelength of laser light, and a second organic polymeric dielectric material having a second optical absorbency to the ablating wavelength of laser light, the first and second optical absorbencies being different from each other. A first layer of one of the organic polymeric materials overlays at least one surface of at least one electrically conductive plane and a second layer of a different organic polymeric material with a different optical absorbency to the material in the first layer overlays the first layer.

DETAILED DESCRIPTION OF VARIOUS AND PREFERRED EMBODIMENTS

Figure 1A:
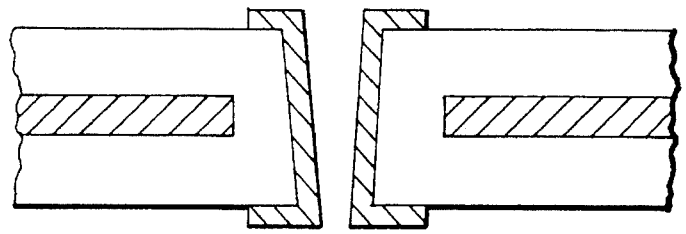
FIG. 1a represents a cross-sectional view of a typical prior art multi-layer card assembly for fabrication of high speed, high density packages.

A typical multi-layer high density structure as seen in FIG. 1a may include a metallic layer 1 surrounded by a dielectric material applied, e.g., by lamination, to both sides of the metallic layer. The metal layers may conduct electricity throughout the card to various components attached thereto. The dielectric also serves to insulate the various components attached thereto. The dielectric serves to insulate the various conductive layers. After formation of a via (hole) in layer 2, another metallic layer 3 may be plated through that hole in the dielectric material.

Figure 1B:
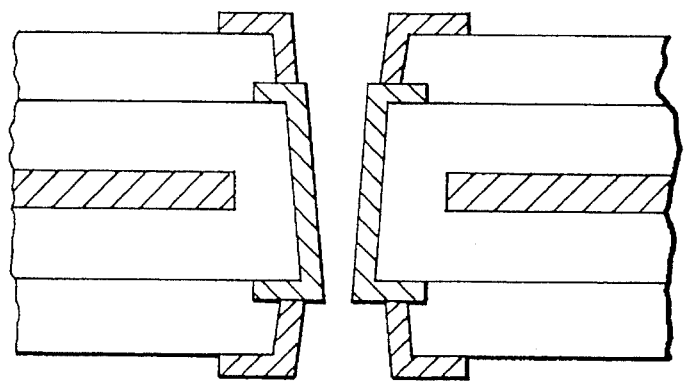
FIG. 1b represents a cross sectional view of the multi-layer assembly of FIG. 1a including additional layers of dielectric material laminated onto the structure to which a hole forming and subsequent plating procedure have been performed with good alignment.

FIG. 1b represents the structure of FIG. 1a with additional layers of dielectric material laminated to both sides of the original structures. In FIG. 1b, acceptable alignment of drilled blind vias in layer 4 and the previously formed hole in layer 2 is shown.

In the typical multi-layer high density structure as seen in FIG. 1b, the two dielectric layers 2 and 4 are typically formed of the same material. Use of the same dielectric material to form adjacent layers has certain advantages, e.g., structural and mechanical, but can cause problems when similar hole making techniques are practiced on the assembly. The problems are particularly pronounced if lasers are used to form the holes. Without very precise, constant monitoring, there is no way to know at what point to shut off the laser when it approaches the boundary between the two dielectric layers.

Due to the fact that the layers are formed from the same dielectric material, the hole forming process can result in the removal of material from both layers. In other words, if the dielectric material is uniform in the lead direction it may be treated as a single ply of a single material. If misregistration occurs, common during the drilling of blind vias to the underlying lands, undesirable attack of the inner, core-level dielectric layer can result.

Figure 2A:
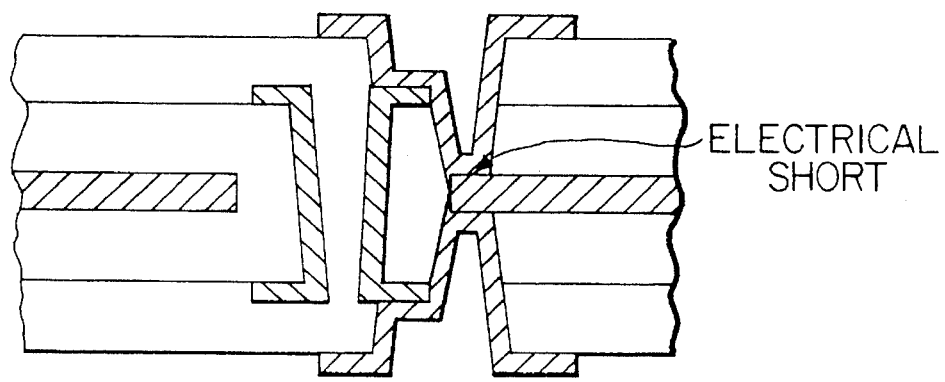
FIG. 2a represents a cross sectional view of a multi-layer structure of FIG. 1a to which a hole forming and subsequent plating procedure have been performed with poor alignment.

As seen in FIG. 2a, this misregistration can lead to the removal of the layer 2. The entire area is then plated with another layer of metal resulting in metal being deposited in contact with the underlying core of metal as in the area 6 indicated by the arrow in FIG. 2a. The subsequent plating over the blind via and contact between the metal layers can result in an electrical short.

The present invention, rather than using two layers of the same dielectric polymeric material, incorporates layered dielectric polymers of different optical absorbencies. According to the present invention, it is essential only that the two polymers used have different optical properties. In fact, the polymers may be essentially identical in all other physical characteristics as long as they are suitable for use in the present invention as dielectric components of an electronic package.

Figure 3A:
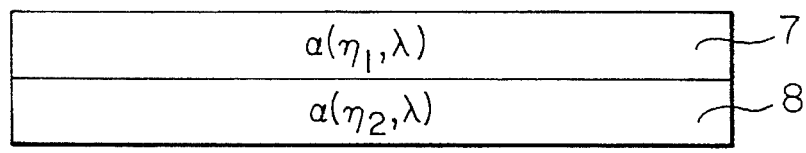
FIG. 3a represents a simplified cross sectional view of one embodiment of the present invention.
Figure 3B:
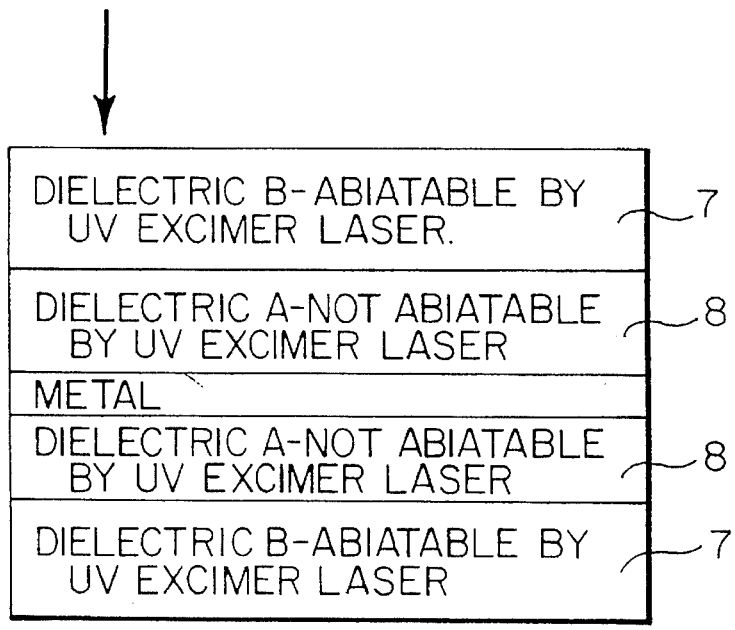
FIG. 3b represents a simplified cross sectional view of one embodiment of the present invention for which layer 7 and 8 are subsequently laminated onto both sides of a metal layer.

Shown very simply in FIG. 3, the present invention includes two adjacent dielectric layers 7 and 8 with absorbencies $\alpha(n_1, \lambda)$ for the layer 7 and $\alpha(n_2, \lambda)$ for the layer 8, where n is the chromosphore concentration and $\lambda$ is the wavelength of the incident radiation (e.g., laser). For the present invention to work, $\alpha(n_1, \lambda) \neq \alpha(n_2, \lambda)$ as seen in FIG. 3b. Layer 8 may directly abut both sides of a metal layer, with layer 7 abutting layer 8 on the outside. A laser or other method used to form holes in the dielectric layers impacts upon layer 7 as shown by the arrow in FIG. 3b.

In the example shown in FIG. 3b, a UV excimer laser is used to form the blind vias. Due to the dielectric's absorbency of a predetermined wave length of light, upon the impact of the laser the layer 7 is ablated or vaporized by the laser. Given the structure of the present invention, the depth of holes drilled in the dielectric material may be easily and precisely controlled. The layer 7, being sensitive to a particular wave length of light, will be removed upon the impingement of that light on the layer. Yet, upon removal of the layer 7 in the area impacted on by the laser and the exposure of the layer 8, the removal of material will cease since the material forming layer 8 is relatively insensitive to that particular wavelength.

Table I includes examples from two categories of materials which may be used to form alternating dielectric layers according to preferred aspect of the present invention when using an excimer laser operating at a wavelength of 308 nm. The list is only illustrative; any number of dielectric materials with different optical absorbencies may be used according to the present invention. Type A and Type B refer to dielectrics A and B as shown in FIG. 3b.

TABLE I

| Type A | Type B |
| --- | --- |
| 1a. PTFE(polytetrafluoroethylene) or FEP (fluorinated ethylene propylene copolymer) or PFA (polytetrafluoroethylene-perfluorovinylether) copolymer or others of a variety of TEFLON-type polymers | 1b. PTFE filled with an absorbing dopant such as polyimide, TINUVIN, or pyrene. |
| 2a. PTFE filled with amorphous silica particles | 2b. PTFE filled with a variety of absorbing particles 2b'. PTFE filled with a variety of absorbing and nonabsorbing particles |
| 3a. PMMA (polymethylmethacrylate) | 3b. PTFE filled with any of a variety of particles and polyimide |

TINUVIN being a substituted hydroxyphenyl benzotriazole (i.e. a UV absorber). By Hawley's Condensed Chemical Dictionary, 11th edition published by Van Nostrand Reinhold.

Using materials with differing non-absorbing optical properties provides differing laser/material interaction. For instance, the core-level dielectric may be selected from a group of materials listed as Type A in Table I. These materials are examples of materials which do not absorb and therefore cannot be drilled at excimer laser wavelengths such as, for example, 308nm. The materials listed as Type A in Table I are suitable for use as the core-level or other layers of dielectric according to the present invention if excimer laser drilling is selected to form the holes in the dielectric laid down over top of the layer formed over the material of Type A.

Absorbing particles which may be used with the present invention include, among others, polymers having suitable chromophores, e.g., those with conjugated bonding, and, therefore, absorb well in the ultraviolet. Glass particles that are nonabsorbing at 308 nm include, e.g., Min-u-sil (U.S. Silica) or equivalent.

An alternate process or method such as the utilization of a $CO_2$ laser or a mechanical punch or drill may then be used to form holes in the material of Type A. The list of Type A and B materials is meant to be illustrative and not exhaustive; any material having an absorbency property different to that of the material laid over top of it may be used. It is necessarily only for the two materials to have different absorbency properties.

If the inner layer 8 as seen in FIG. 3 is formed of a material labelled Type A in Table I, the outer layer 7 may be formed of a material listed as Type B in Table I. Such material is ablated at excimer laser wavelengths. By using this construction, if less than acceptable alignment occurs during excimer laser drilling of blind vias through layer 7, no adverse electrical impact on the structure will result.

Figure 2B:
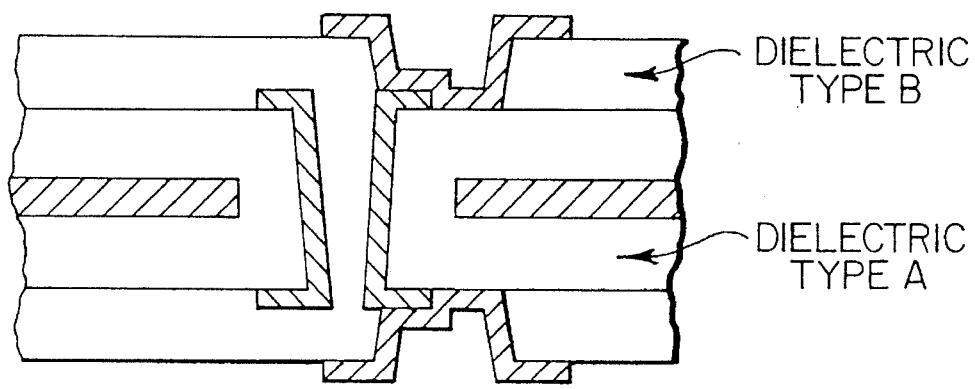
FIG. 2b represents a multi-layer card assembly of FIG. 1a incorporating aspects of the present invention to which a subsequent hole forming and subsequent plating procedure have been performed with poor alignment.

The result of the use of such materials having differing absorbency properties may be seen in FIG. 2b. Unlike in FIG. 2a, with the two dielectric layers formed of a similar material, in FIG. 2b, the removal of the layer 7 does not result in the removal of the inner layer 8. Therefore, the electrical shorting which can occur in the embodiment shown FIG. 2b is precluded from occurring.

Preferably, the materials used to form the two layers, although not similar in absorbency of similar wavelengths of light, have similar mechanical, thermal, chemical, electrical and other such properties. For example, PTFE (layer 8) and polyimide-doped PTFE (layer 7) or quartz-filled PTFE (layer 8) and polyimide-doped quartz-filled PTFE (layer 7)

and polyimide-doped glass-filled PTFE (layer 7) may be used, where concentrations of the dopant polyimide are low enough not to effect the above mentioned properties. Such concentrations of dopant are on the order of about 5% polyimide by weight or less. In addition to alleviating alignment concerns during drilling of the outer dielectric layer, the use of materials labeled as Type A in Table I for core fabrication will facilitate the deletion of metal using excimer lasers for repair of short circuits at the surface of the core level shown in FIG. 1a.

Table II presents the different drilling rates for the various Type A and Type B materials from Table I using an excimer laser operating at 308 nm at an energy per unit area per pulse (fluence) at the surface of the dielectric of 12 Joules per square centimeter ($J/cm^2$).

TABLE II

| Material | Drilling Rate (microns/pulse) |
| --- | --- |
| Type A | |
| PTFE | 0 |
| PTFE filled with silica particles | <0.5 |
| Type B | |
| 0.5 wt % polyimide in PTFE | 5.0 |
| 5.0 wt % polyimide in PTFE | 3.5 |
| PTFE filled with a variety of absorbing particles with or without addition of polyimide | 3.0–4.0 |

Figure 4A:
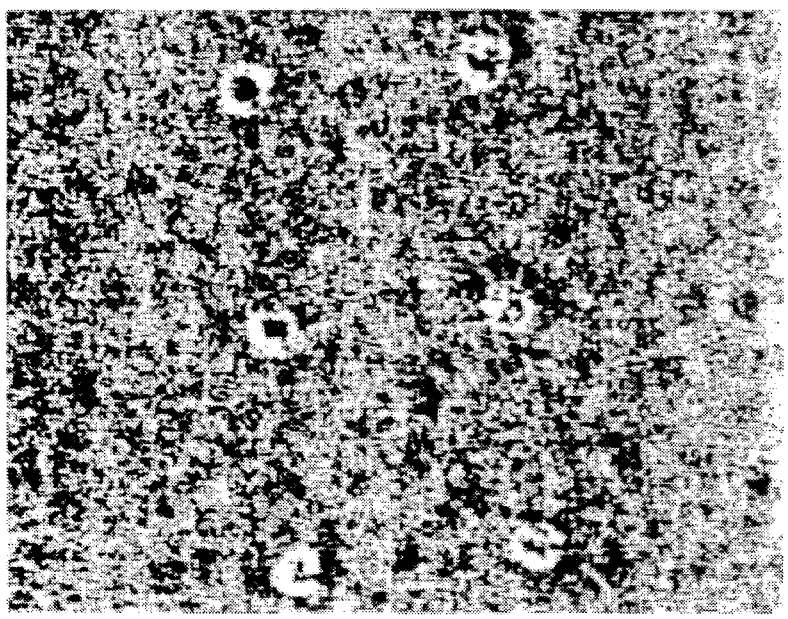
FIGS. 4a and 4b represent photographs of 2 different materials, which may be used in embodiments of the present invention, after undergoing a hole formation process.
Figure 4B:
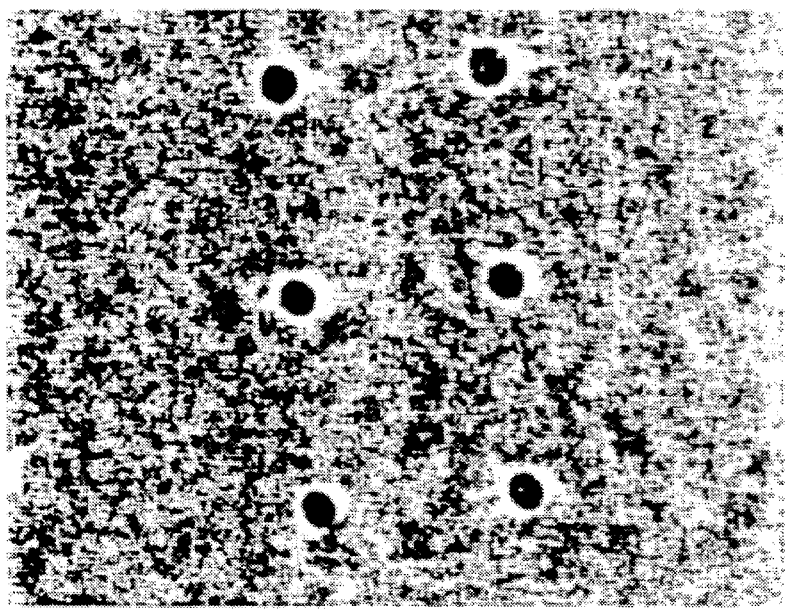

FIG. 4a represents photographs of the dielectric 2a in Table I, PTFE filled with silica particles, after attempting to drill through two mils of the material with 100 pulses using an excimer laser (308 nm) at a fluence of 12 $J/cm^2$. As can be seen from the photograph in FIG. 4a, the material has only been only slightly ablated, i.e., very shallow holes. FIG. 4b shows a sample of material 2b in Table I, PTFE filled with a variety of absorbing glass particles, after being drilled with only 16 pulses. As is evident from FIG. 4b, relatively complete and clean holes have been formed all the way through the material. Thus, FIGS. 4a and 4b demonstrate how these two materials could be used in one embodiment of the present invention.

Figure 5A:
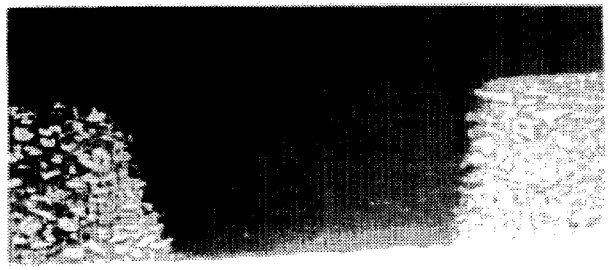
FIGS. 5a, 5b, and 5c represent cross sectional scanning electron micrographs of materials, which may be used in embodiments of the present invention, after being subjected to a hole formation process.
Figure 5A:
Figure 5B:
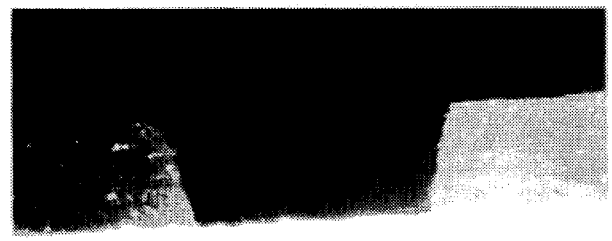
Figure 5B:
Figure 5C:
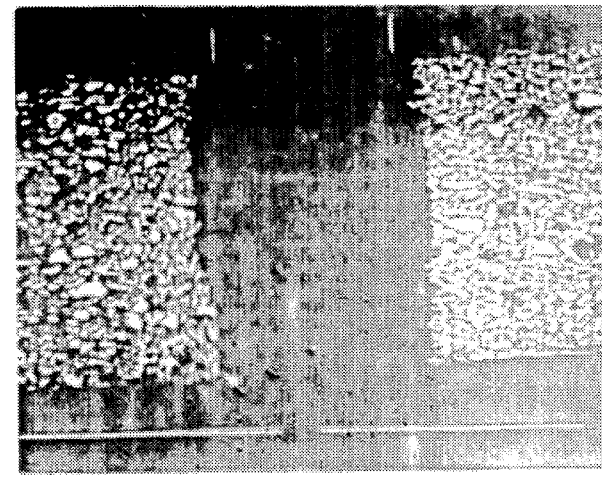

Further evidence of the differential effect of various wave lengths of light on the various materials is shown in FIG. 5a which represents a SEM micrograph of material 2b from Table I drilled under nominal excimer laser processing conditions. FIG. 5b represents a photograph of a similarly treated sample of material 3b from Table I. FIG. 5c shows a SEM micrograph of material 2A of Table I drilled using a CO2 laser. The photographs in FIG. 5 represent further evidence of the usefulness of the present invention.

The present invention also includes a method of forming a multi-layer electronic circuit package. Preferably, at least one layer of the multi-layer electronic circuit package includes an electrically conductive plane. Over one, two, or all surfaces of the conductive layer is deposited a first organic, polymeric dielectric material. The first layer may be chosen, for example, from the materials listed as Type A in Table I. The first organic polymeric material preferably has a first absorbency to an ablating wavelength of laser light.

After the first layer of dielectric is laid down, circuitization, including lands, may be deposited on the first layer. Upon the first dielectric layer and any circuitization may be deposited a second layer of a second organic, polymeric dielectric material. The second organic polymeric material preferably has a second optical absorbency different than the first optical absorbency of the first dielectric layer at the same laser ablating wavelength. Using a laser, a via may be formed through the second dielectric layer to the circuitization by ablating the material forming the second layer at the laser ablating wavelength. Conductive material may then be deposited on the surfaces of the via.

The dielectric materials may be deposited on the conductive layer in any order, depending upon the process used to form vias or other passages in the various layers. Means other than a laser may be used to form passages through the dielectric layers, such as a mechanical punch. Further, the process is not limited to any specific wavelengths of laser light.

We claim:

1. A multi-layer electronic circuit package, comprising:
   at least one electrically conductive plane;
   a first organic polymeric dielectric material having a first optical absorbency to an ablating wavelength of laser light; and
   a second organic polymeric dielectric material having a second optical absorbency to said ablating wavelength of laser light, whereby said first material dielectric material absorbs wavelengths of light that are not the same as wavelengths of light that are absorbed by said second dielectric material;
   wherein a first layer of said first or said second organic polymeric materials overlays at least one surface of said at least one electrically conductive plane and a second layer of the other of said first and second organic polymeric materials overlays said first layer.

2. The multi-layer electronic circuit package according to claim 1, wherein said first organic polymeric dielectric material is selected from the group consisting of polytetrafluoroethylene and polytetrafluoroethylene filled with quartz particles and said second organic polymeric dielectric material is selected from the group consisting of polytetrafluoroethylene filled with an absorbing dopant, polytetrafluoroethylene filled with absorbing particles, and polytetrafluoroethylene filled with glass particles and polyimide.

3. The multi-layer electronic circuit package according to claim 2, wherein said dopant is polyimide in polytetrafluoroethylene, a substituted hydroxyphenyl benzotriazole in polymethylmethacrylate, or pyrene in polymethylmethacrylate.

4. The multi-layer electronic circuit package according to claim 2, wherein said absorbing particles are polymers having suitable chromophore groups.

5. The multi-layer electronic circuit package according to claim 2, wherein said glass particles are silicas.

6. The multi-layer electronic circuit package according to claim 1, wherein said first organic polymeric dielectric material is polytetrafluoroethylene having an optical absorbency to an ablating wavelength of laser light of 10,600 nm and said second organic polymeric dielectric material is polyimide-doped polytetrafluoroethylene having an optical absorbency to an ablating wavelength of laser light of 308 nm.

7. The multi-layer electronic circuit package according to claim 1, wherein a second electrically conductive plane at least partially overlays said second layer of said organic polymeric dielectric material.

8. The multi-layer electronic circuit package according to claim 1, wherein a layer of circuitization overlays said first layer of organic polymeric dielectric material and said second layer of organic polymeric dielectric material overlays said first layer and said circuitization layer.

* * * * *